(12) United States Patent
Workman et al.

(10) Patent No.: US 7,331,106 B2
(45) Date of Patent: Feb. 19, 2008

(54) UNDERFILL METHOD

(75) Inventors: Derek B. Workman, Noblesville, IN (US); Arun K. Chaundhuri, Carmel, IN (US); Eric M Berg, Russiaville, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/435,211

(22) Filed: May 15, 2006

(65) Prior Publication Data

US 2006/0200985 A1 Sep. 14, 2006

Related U.S. Application Data

(62) Division of application No. 10/397,605, filed on Jul. 17, 2003, now abandoned.

(51) Int. Cl.
*H01L 21/48* (2006.01)
*H01L 21/56* (2006.01)
*H05K 3/30* (2006.01)

(52) U.S. Cl. ............................. 29/840; 29/832; 29/841; 174/259; 174/260; 257/773; 257/778; 257/780; 257/783; 438/108; 438/113; 438/118

(58) Field of Classification Search ................ 29/860, 29/832, 840, 841; 257/783, 773, 778, 780; 228/180.22; 438/108, 118, 113; 174/256, 174/259, 260

See application file for complete search history.

(56) References Cited

U.S. PATENT DOCUMENTS 5,681,757 A 10/1997 Hayes ........................ 257/778
6,076,723 A 6/2000 I-Tsung Pan ................. 228/33
6,121,689 A 9/2000 Capote et al. ............... 257/783
6,291,884 B1 9/2001 Glenn et al. ................. 257/747
6,307,749 B1 10/2001 Daanen et al. .............. 361/704
6,367,150 B1 4/2002 Kirsten ........................ 29/840

(Continued)

FOREIGN PATENT DOCUMENTS

WO 00/04430 1/1999
WO 02/058108 7/2002

OTHER PUBLICATIONS

X20030422, adsie, Apr. 22, 2003, ☐http://web.archive.org/web/20030422134845/http://www.admatechs.co.jp/sie.html.*

(Continued)

*Primary Examiner*—Peter Vo
*Assistant Examiner*—Livius R. Cazan
(74) *Attorney, Agent, or Firm*—Jimmy L. Funke

(57) ABSTRACT

A process for selectively depositing a filled underfill material onto a die surface without covering solder bumps present on the die. The process entails microjetting a polymer matrix material, a filler material, and optionally a fluxing material onto the die surface. Together, the polymer matrix and filler materials define the filled underfill material in which the filler material is dispersed to reduce the coefficient of thermal expansion of the underfill material. The resulting underfill material surrounds but does not cover the solder bumps. The die is then placed on a substrate on which a second underfill material is present, forming a composite underfill layer that completely fills the space between the die and substrate and forms a fillet on a peripheral wall of the die.

11 Claims, 2 Drawing Sheets

U.S. PATENT DOCUMENTS

| | | |
|---|---|---|
| 6,399,426 B1 | 6/2002 | Capote et al. .............. 438/126 |
| 6,434,817 B1 | 8/2002 | Feigenbaum et al. ......... 29/840 |
| 6,518,677 B1 | 2/2003 | Capote et al. .............. 257/783 |
| 6,566,234 B1 | 5/2003 | Capote et al. .............. 438/458 |
| 6,766,817 B2 | 7/2004 | da Silva ........................ 137/1 |
| 6,881,591 B2 | 4/2005 | Gotoh et al. .................... 438/4 |
| 6,916,684 B2 | 7/2005 | Stepniak et al. ............ 438/108 |
| 6,981,317 B1 * | 1/2006 | Nishida ....................... 29/840 |
| 7,022,410 B2 * | 4/2006 | Tonapi et al. .............. 428/414 |
| 7,028,879 B2 * | 4/2006 | Farrar et al. .................. 228/33 |
| 2002/0089067 A1 | 7/2002 | Crane et al. ................ 257/778 |

OTHER PUBLICATIONS

X20021119, adsie, Nov. 19, 2002, ☐http://web.archive.org/web/20021119085432/http://www.admatechs.co.jp/sie.html.*

European Search Report dated Jun. 22, 2004—EP 04 07 5759.

XP-002285386, Hayes et al., Development and Application by Ink-Jet Printing of Advanced Packaging Materials, Mar. 14, 1999.

XP-002285387, Highly Pure and Spherical Silica, http://web.archive.org/web/2003...//www.admatechs.co.jp/sie.html.

* cited by examiner

UNDERFILL METHOD

CROSS REFERENCE TO RELATED APPLICATIONS

This is a division of application Ser. No. 10/397,605 filed on Jul. 17, 2003 now abandoned.

STATEMENT REGARDING FEDERALLY SPONSORED RESEARCH

Not applicable.

BACKGROUND OF THE INVENTION (1) Field of the Invention

The present invention generally relates to underfill processes and materials for flip-chip mounted dies. More particularly, this invention relates to a process for selectively depositing a filled, wafer-applied underfill material on a die prior to die attachment and without covering solder bumps present on the die.

(2) Description of the Related Art

Underfilling is well known for promoting the reliability of surface-mount components, such as flip chips (chip scale packages, or CSP's) and ball grid array (BGA) packages, that are physically and electrically connected to traces on organic or inorganic substrates with numerous solder bump connections. Conventional underfill processes generally involve using a specially formulated dielectric material to completely fill the void between the component and the substrate and encapsulate the solder bump connections of the component. In conventional practice, underfilling takes place after the component is attached to the substrate. The underfill material is placed along the perimeter of the component, and capillary action is relied on to draw the material beneath the component. An alternative technique is to deposit a no-flow underfill material on the substrate surface, place the bumped die on the substrate (forcing the solder bumps through the underfill material), and then attach the die by reflow soldering. Another underfill method is wafer-applied underfilling (WAU), in which a film of underfill material is laminated to a wafer or chip prior to solder bumping or to a bumped wafer or chip prior to die attachment. Yet another technique disclosed in U.S. Pat. No. 5,681,757 is to deposit an underfill material on the die prior to die attachment through the use of a microjetting (inkjet) process, in which droplets of the underfill material are deposited on the die surface between solder bumps. This technique is represented in FIGS. 1 and 2, which shows a die 110 with solder bumps 112 and an underfill material 114 on the die surface between bumps 112. The die 110 is registered with bond pads 118 on a substrate 116, and the solder bumps 112 reflowed to form solder connections 120.

For optimum reliability, the composition of an underfill material and the underfill process parameters must be carefully controlled so that voids will not occur in the underfill material beneath the component, and to ensure that a uniform fillet is formed along the entire perimeter of the component. Capillary-flow underfilling processes can generally be performed to ensure an adequate and uniform fillet, which has been shown to be an essential factor in terms of the thermal cycle fatigue resistance of the solder connections encapsulated by the underfill. However, obtaining a void-free underfill using a capillary-flow technique can be difficult if the die has a low standoff height and/or has closely-spaced solder bumps. In contrast, the microjetting process of U.S. Pat. No. 5,681,757 generally ensures a void-free underfill, but the amount of underfill material that can be applied without covering the solder bumps is insufficient to form an adequate and uniform fillet. Such an inadequate fillet 128 is represented in FIG. 2, in that the fillet 128 does not extend up along the peripheral wall 130 of the die 110.

In addition to the above considerations, underfill materials must have a coefficient of thermal expansion (CTE) that is relatively close to that of the solder connections, component and substrate. As known in the art, an acceptable CTE match is necessary to minimize CTE mismatches that reduce the thermal fatigue life of the solder connections. Dielectric materials having suitable flow and processing characteristics for underfill applications are typically thermosetting polymers such as epoxies. To achieve an acceptable CTE, a fine particulate filler material such as silica is added to the underfill material to lower the CTE from that of the polymer to something that is more compatible with the CTE's of the component, substrate, and the solder composition of the solder connections. Suitable fill levels and compositions for the filler material are dependent on the particular polymer used and the amount and size of filler material necessary to achieve the desired CTE.

While highly-filled capillary-flow underfill materials have been widely and successfully used in flip chip assembly processes, expensive process steps are typically required to repeatably produce void-free underfills. These steps can limit the versatility of the flip chip underfill process to the extent that capillary-flow underfilling is not practical for many flip chip applications, especially those chips with fine pitch solder connections and low standoff heights. These applications are candidates for no-flow and wafer-applied underfill materials. However, a drawback of wafer-applied underfilling techniques is that, depending on when the underfill material is applied, the bond pads or the solder bumps present on the wafer or chip must be re-exposed prior to die attachment, such as by burnishing or a laser ablation process. Furthermore, a drawback of no-flow underfill materials is that they typically do not contain filler materials because of the tendency for the filler particles to hinder the flip chip assembly process. For example, particles can become trapped between the solder bumps and the bond pads to interfere with the formation of a metallurgical bond, reducing the reliability of the electrical connection. With regard to U.S. Pat. No. 5,681,757, no mention is made of whether a filled underfill material is compatible with the disclosed microjetting process. However, conventional filler levels and filler materials capable of achieving an acceptable CTE for an underfill material are generally incompatible with inkjet technology because of the excessively high viscosity of such materials.

In view of the above, it would be desirable if an underfill process were available that overcame the difficulties and shortcomings of capillary-flow, no-flow and wafer-applied underfill materials and processes.

BRIEF SUMMARY OF THE INVENTION

The present invention provides a process for selectively depositing a filled, wafer-applied underfill onto a die without covering solder bumps present on the die. According to a preferred aspect of the invention, the underfill is a composite underfill comprising multiple different underfill materials that can be deposited prior to die placement. According to another preferred aspect of the invention, the underfill materials are combined in a manner that enables void-free underfilling and ensures the formation of adequate underfill fillets to promote device reliability, and a filler material is incorporated within the underfill to reinforce the solder connections that attach the die to its substrate. The underfilling process of this invention is suitable for use in underfill applications that have previously required capillary-flow underfill materials, as well as those applications in which capillary-flow underfill techniques have been unsuccessful, such as fine-pitch applications.

The underfill process of this invention generally entails microjetting a polymer matrix material, a filler material, and preferably a fluxing material onto a surface of the component on which solder bumps are present, such as on under-bump metallurgy (UBM) on the component surface. Together, the polymer matrix material and filler material define a filled underfill material in which the filler material is dispersed to reduce the coefficient of thermal expansion of the filled underfill material. The polymer matrix and filler materials can be blended prior to deposition such that the filled underfill material is directly deposited on the component surface, or the filler material can be deposited before the polymer matrix material such that they effectively form the filled underfill material in situ on the component surface. Furthermore, the polymer matrix and filler materials are selectively deposited so that the underfill material surrounds but does not cover the solder bumps or their UBM's. A second, unfilled underfill material is deposited on the substrate to which the component is to be mounted by registering and reflow soldering the component solder bumps to bond pads on the substrate surface. During deposition, the bond pads may be covered by the unfilled underfill material.

The component solder bumps are then registered with the substrate bond pads by pressing the component and its solder bumps into the unfilled underfill material on the substrate. As a result, the filled and unfilled underfill materials combine to form the composite underfill, which fills the space between the component and the substrate and extends onto a peripheral wall of the component. The solder bumps and composite underfill are then heated so that the solder bumps melt and the composite underfill cures to form a composite underfill layer. Finally, the molten solder bumps and the underfill layer are cooled so that the molten solder bumps form solid electrical interconnects that are metallurgically bonded to the bond pads, the composite underfill layer encapsulates the interconnects and defines a fillet that extends onto the peripheral wall of the component, and the space between the component and the substrate is free of voids.

According to a preferred aspect of the invention, the composite underfill layer is continuous, void-free, and completely fills the space between the component and the substrate. Because the composite underfill layer incorporates a filler material, its CTE is reduced to something close to that of the solder connections it protects, such that the underfill process of this invention is believed to be capable of achieving the product reliability previously possible only with the use of capillary-flow underfill materials and processes, but without the processing costs and limitations associated with capillary-flow underfill materials. Furthermore, because the underfill materials are selectively deposited so as not to cover the solder bumps or the underlying UBM's, the underfill process avoids the prior art practice of using either a burnishing or an ablation technique to re-expose either the solder bumps or UBM's on the die surface prior to die attachment. Finally, the filler material is incorporated within the composite underfill in a manner that promotes reinforcement of the UBM/bump interface, while the unfilled underfill material is primarily responsible for the formation of adequate fillets along the component periphery to promote device reliability.

Other objects and advantages of this invention will be better appreciated from the following detailed description.

DETAILED DESCRIPTION OF THE INVENTION

Figure 1:
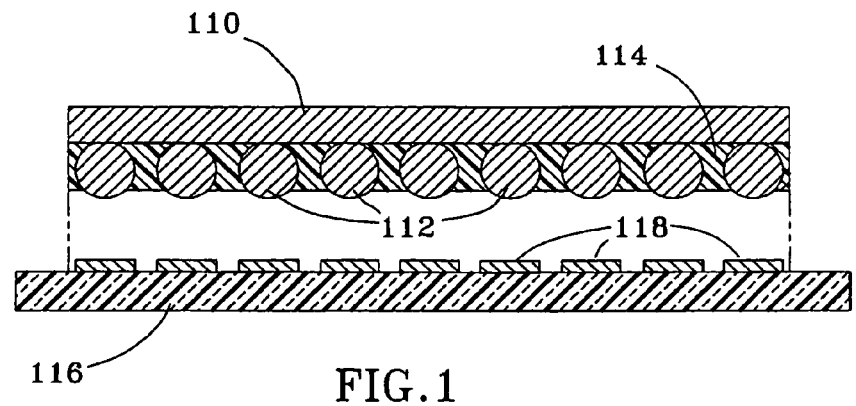
FIGS. 1 and 2 represent a microjetted underfill process in accordance with the prior art.
Figure 2:
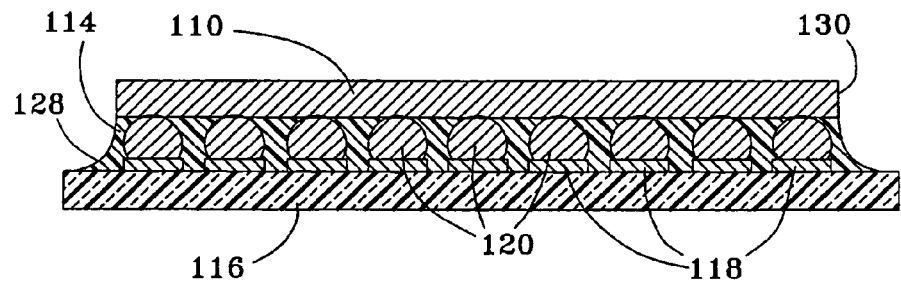
Figure 3:
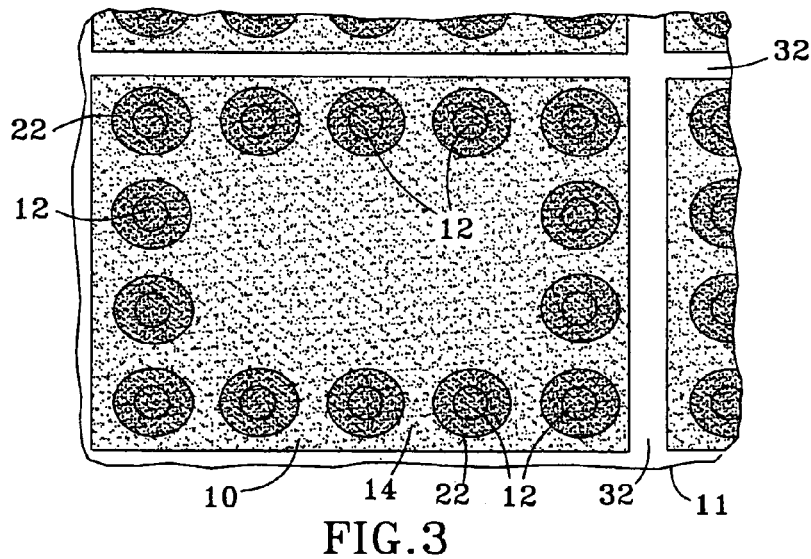
FIG. 3 represents a plan view of a wafer surface on which a wafer-applied underfill material has been deposited in accordance with an embodiment of the present invention.
Figure 4:
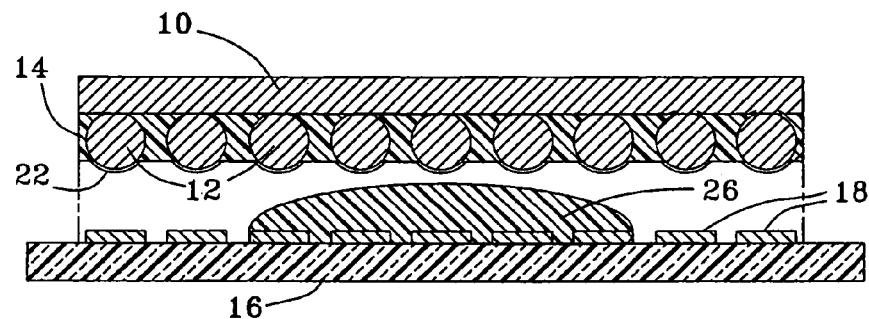
FIGS. 4 and 5 are side views representing two steps of an underfilling process, in which a die singulated from the wafer of FIG. 3 is placed and attached to a surface of a substrate on which a second underfill material was pre-applied.
Figure 5:
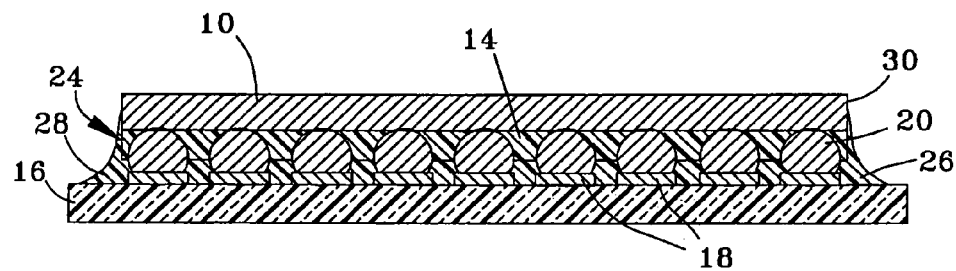

FIG. 3 represents a wafer 11 on which individual dies 10 are delineated by scribe lines 32 (e.g., saw streets), and on which a filled wafer-applied underfill material 14 has been selectively deposited in accordance, with the present invention. As illustrated, the invention finds use in the fabrication of semiconductor devices, such that silicon or another semiconductor is a suitable material for the wafer 11 (and therefore the dies 10). Furthermore, the invention finds particular application in the process of attaching flip chips, as represented in FIGS. 4 and 5 in which one of the dies 10 from FIG. 3 is shown being attached to bond pads 18 on a substrate 16. However, other types of devices that are attached by reflowing solder bumps are also within the scope of this invention. It should be noted that the various features of the wafer 11 and dies 10 are not to scale in FIGS. 3 through 6.

As represented in FIG. 3, the filled underfill material 14 has been selectively deposited between solder bumps 12 on the wafer surface, without covering the bumps 12, UBM's (not shown) on which the bumps 12 are formed, or the scribe lines 32 on the wafer surface. A flux material 22 is also shown as having been selectively deposited to contact and preferably surround and cover the solder bumps 12, such that the flux material 22 is surrounded by the filled underfill material 14. The filled underfill material 14 generally comprises a dielectric polymer matrix material in which a particulate filler material is dispersed. Suitable materials for the polymer matrix include low viscosity thermoset resins or cyclic polymer precursors. Examples of suitable polymer matrix materials include an epoxy resin commercially available from Specialty Chemical, Inc., under the name CVC, and a polymer precursor conriercially available under the name CBT resins from Cyclics Corporation.

The filler material is chosen in part on the basis of having a coefficient of thermal expansion (CTE) that is lower than that of the polymer matrix for the purpose of reducing the overall CTE of the filled-underfill material 14 to something closer to the CTE's of the substrate 16, die 10 and solder bumps 12. Suitable compositions for the filler material include silica, though other filler materials could be used, including silicon nitride ($Si_3N_4$), silicon carbide (SiC), aluminum nitride (AlN), boron nitride (BN), or various other materials with suitably low CTE's. As will become evident from the following discussion, suitable particle sizes for the filler material will depend on the manner in which the filler is incorporated into the polymer matrix to form the filled underfill material 14.

Finally, the fluxing material 22 contains a fluxing compound capable of cracking, displacing and/or reducing oxides on the solder bumps 12 and bond pads 18 that would otherwise interfere with the ability of these features to metallurgically bond to each other. Suitable flux materials 22 include an epoxy flux available under the name SE-CURE 9603 from Kester and an oligomer available under the name TF38 from Heraeus. Both of these are preferably thinned with a solvent prior to application. It is foreseeable that other fluxing compounds could be used, including polymer flip chip fluxes diluted with a solvent in order to reduce their viscosity.

As previously noted, FIGS. 4 and 5 represent steps by which a die 10 singulated from the wafer 11 shown in FIG. 3 can be flip-chip mounted to a substrate 16 on which bond pads 18 (or other suitable terminals) are provided for registration with the solder bumps 12 on the die 10. The substrate 16 may be a circuit board formed of various materials, such as a thin laminate printed wiring board (PWB), or any other suitable circuit board material known in the art. As is evident from FIG. 4, the filled underfill material 14 does not cover the solder bumps 12, but instead fills the spaces between solder bumps 12 on the die surface. FIG. 5 represents the result of placing the die 10 on the substrate 16 and then reflowing the solder bumps 12 to form solder connections 20 that electrically interconnect the bond pads 18 with circuitry (not shown) on the die 10. During the reflow process, the filled underfill material 14 forms part of a composite underfill layer 24 in which the filler material is dispersed.

FIGS. 4 and 5 represent the remainder of the composite underfill layer 24 as being formed by a second material 26 that is deposited on the surface of the substrate 16 prior to placement of the die 10. In contrast to the filled underfill material 14, the second material 26 preferably does not contain any filler material. The primary role of the unfilled material 26 is as an adhesive to form a thin bond line that bonds the filled underfill material 14 to the substrate 16. For this purpose, a bond line thickness of as little as about 0.001 inch (about 25 micrometers) is sufficient. A second role of the unfilled material 26 is to provide a sufficient volume of additional underfill material to form a fillet 28 along the peripheral wall 30 of the die 10, as depicted in FIG. 5. In view of these functions, the unfilled material 26 must be compositionally compatible with the filled underfill material 14, and have suitable flow characteristics. Suitable materials for the unfilled material 26 include various epoxy formulations used as adhesives in the electronics industry, particularly epoxy-based resins such as bisphenol F and phenol novalac. The requirement to separately deposit the flux material 22 on the solder bumps 12 may be avoided by the use of a flux-containing epoxy adhesive for the unfilled material 26, such as no-flow underfill materials commercially available from Loctite under the names Fluxfill 2000 and Fluxfill 2200, both of which contain bisphenol F and can be cured by anhydride cure mechanisms commonly used to cure underfills.

As represented in FIG. 5, minimal intermixing of the filled and unfilled materials 14 and 26 occurs during mating of the die 10 with the substrate 16 and the subsequent reflowing of the solder bumps 12 to form the solder connections 20. As such, the underfill layer 24 is a composite, formed by two relatively distinct filled and unfilled regions. As noted above, the unfilled material 26 serves the critical role of forming the fillet 28 surrounding the die 10, while the filled underfill material 14 serves the equally critical role of reinforcing the interface between the solder connections 20 and their respective UBM.

Figure 6:
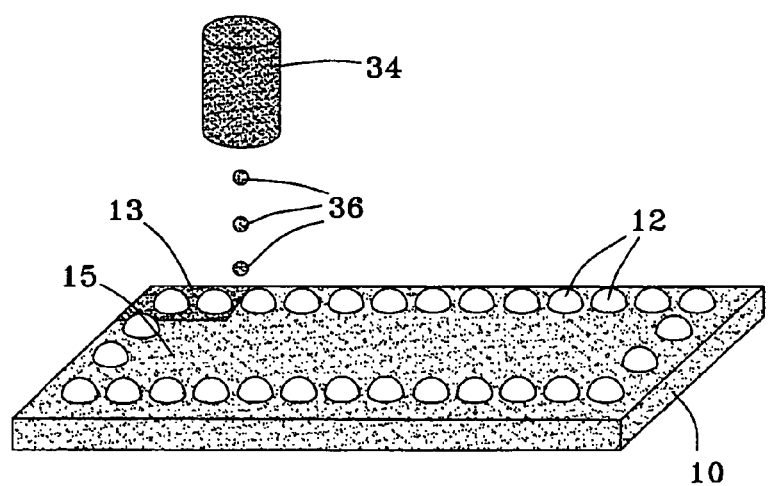
FIG. 6 represents a process of forming a filled, wafer-applied underfill material on a wafer surface in accordance with a second embodiment of the present invention.

According to a preferred aspect of the invention, the filled underfill material 14 (including its polymer resin matrix and filler material) and the flux material 22 are deposited by a microjetting (inkjet) technique, such that these materials are deposited as discrete droplets 36 as represented in FIG. 6. The droplets 36 are shown as being dispensed by a print head 34, which is preferably controlled using a suitable program to operate on a drop-on-demand basis, though a continuous jetting technique may also be acceptable. In such a process, the coordinates of each solder bump 12 are preferably identified prior to depositing the filled underfill material 14, such that each droplet 36 can be precisely deposited at a selected (x,y) coordinate on the wafer surface without coating any of the bumps 12. The print head 34 is preferably one of a number of print heads that enable a single piece of equipment to simultaneously dispense the polymer matrix material 13, the filler material 15 and the flux material 22. A suitable jetting apparatus for this purpose is manufactured by Microfab under the name Polymer Jet and designated as a "drop-on-demand print head for high temperature operation." The solder bumps 12 can also be deposited using a jetting process, as taught in commonly-assigned U.S. patent application Ser. No. 09/435,843 to Balduc.

The embodiment of the invention depicted in FIG. 6 involves the separate and sequential deposition of the filler material and the polymer matrix material onto the wafer surface. In FIG. 6, the filler material has been deposited first to form a filler particle layer 15, which is being overcoated with droplets 36 of the polymer matrix material to form a polymer layer 13. With this approach, the filler material can be deposited while suspended in a low-viscosity volatile solvent, which is evaporated prior to deposition of the polymer layer 13. The polymer layer 13 is preferably formed of a low-viscosity resin (may require a solvent-borne resin) or cyclic polymer precursor, which when deposited on top of the dry particle layer 15 is able to wet the filler particles such that the filler particles become dispersed in the polymer layer 13. In effect, the embodiment of FIG. 6 forms in situ the filled underfill material 14 represented in FIGS. 3 and 4. The flux material 22 can be selectively deposited on the solder bumps 12 before or after depositing the polymer and particle layers 13 and 15. An advantage of selectively and separately depositing the flux material 22 on or around each solder bump 12 is that an appropriate flux compound for a given combination of surface finish and bump alloy can be used without affecting the choice of filled underfill material 14, and the filled underfill material 14 can be deposited without diluting the flux material 22.

An alternative approach to FIG. 6 is to combine the polymer matrix and filler materials prior to deposition, such that the filled underfill material 14 is deposited directly onto the wafer surface. For this embodiment, the filler material preferably consists of nanoparticles (i.e., particles of less than one hundred nanometers), such as nano-clay materials, molecular silica or polyhedral oligomeric silsesquioxane compounds. Nanoparticles are employed with this embodiment to minimize the effect that the filler material will have on the viscosity of the filled underfill material 14 and to avoid clogging the jet orifice of the print head 34. As with the previous approach, the flux material 22 can be selectively deposited on the solder bumps 12 before or after depositing the filled underfill material 14.

With either of the above approaches, the polymer matrix material can be solidified by cooling (if the matrix material is a thermoplastic) or partial curing (e.g., by UV radiation if the matrix material is a photopolymer) after deposition, followed by singulation of the dies 10 from the wafer 11, for example, by sawing along the scribe lines 32. Notably, because the microjetting process is controlled so as to avoid deposition of the filled underfill material 14 on the scribe lines 32, the dies 10 can be singulated without producing underfill debris during singulation.

As represented in FIGS. 4 and 5, one of the singulated dies 10 is then placed on the substrate 16 and its solder bumps 12 are caused to penetrate the unfilled material 26 and contact their respective bond pads 18. During this step, the unfilled material 26 is forced laterally outward to form the fillet 28, as depicted in FIG. 5. The assembly then undergoes a conventional reflow process to melt and coalesce the solder bumps 12, which upon cooling form the solder connections 20 that metallurgically bond to their bond pads 18. The solder bumps 12 are fluxed by the flux material 22 during reflow to promote the metallurgical bond between the solder connections 20 and their respective bond pads 18. Also during reflow, the polymer matrix material of the filled underfill material 14 and the unfilled material 26 may undergo curing if formed of appropriate heat-curable polymer materials. In any event, these materials 14 and 26 combine to form the composite underfill layer 24 represented in FIG. 5. A minimal amount of the unfilled material 26 can be applied to form the fillet 28 and a very thin bond line between the substrate 16 and that portion of the underfill layer 24 formed by the filled underfill material 14. The portion of the underfill layer 24 that remains substantially free of filler particles has minimal negative impact on the fatigue life of the solder connections 20, because the critical solder joint-to-UBM interface is reinforced by the filled underfill material 14. The underfill materials 14 and 26 completely fill the spaces between the solder connections 20 and the space between the lower surface of the die 10 and the upper surface of the substrate 16, yielding a void-free underfill layer 24. Upon cooling the assembly, the underfill layer 24 encapsulates the solder connections 20 and is bonded to the substrate 16 and die 10.

In view of the above, the composite underfill layer 24 formed by the filled underfill material 14 and unfilled material 26 in accordance with this invention is able to exhibit a CTE that is sufficiently close to that of the solder connections 20 to improve the reliability of the die assembly, while having a simplified manufacturing process and a reduced number of process steps as compared to capillary-flow underfill materials. The underfill process of this invention enables a die to be placed in a manner similar to a no-flow underfill process, but with the added benefit of a filler layer (14) near the solder joint-UBM interface. Furthermore, because the filled underfill material 14 is selectively deposited so as not to cover the solder bumps 12, the underfill process of this invention avoids the prior art practices of burnishing a laminated underfill material to re-expose solder bumps on a die surface prior to die attachment, and laser ablating a pre-deposited underfill layer to expose the UBM on a die prior to solder bumping. According to a preferred aspect of the invention, the filled underfill material 14 is also deposited at the wafer level, and is not deposited on the scribe lines 32 that delineate the dies 10 on the wafer surface to reduce the amount of debris generated during the singulation process. Finally, the present invention provides for the incorporation of a filler material into the composite underfill layer 24 in a manner that allows for the formation of a fillet 28 that extends onto the peripheral wall 30 of the die 10, which significantly promotes device reliability.

While the invention has been described in terms of a preferred embodiment, it is apparent that other forms could be adopted by one skilled in the art. Accordingly, the scope of the invention is to be limited only by the following claims.

The invention claimed is:

1. A method of underfilling a flip chip die, the method comprising the steps of:

microjetting a filled underfill material onto a surface of a wafer on which individual dies are delineated and separated by scribe lines, each of the dies having solder bumps associated therewith, the filled underfill material comprising a polymer matrix material and a dispersion of particulate filler material that reduces the coefficient of thermal expansion of the filled underfill material, the filled underfill material being selectively deposited between the solder bumps and not over the solder bumps or the scribe lines;

singulating the dies from the wafer along the scribe lines, without cutting through the filled underfill material to prevent underfill debris from separating from the surface of the wafer;

depositing an adhesive on a substrate having bond pads on a surface thereof, the adhesive being substantially free of a filler material;

registering the solder bumps of one of the dies with the bond pads on the substrate so that the filled underfill material and the adhesive fill a space defined by and between the die and the substrate and the adhesive extends from the substrate past the space and the filled underfill material onto a peripheral wall of the die to form a fillet between the die and the substrate;

heating the substrate, the solder bumps, the filled underfill material and the adhesive so that the solder bumps melt and so that the filled underfill material and the adhesive form a composite underfill layer having discrete filled and unfilled portions; and then cooling the molten solder bumps and the composite underfill layer so that the molten solder bumps form solid electrical connections that are metallurgically bonded to the bond pads, the composite underfill layer encapsulates the connections, the unfilled portion of the composite underfill layer defines the fillet that extends onto the peripheral wall of the die, and the space between the die and the substrate is free of voids.

2. The method according to claim 1, wherein the microjetting step further comprises microjetting a flux material onto the surface of the wafer so as to contact the solder bumps, the filled underfill material is selectively deposited so as to surround and contact the flux material, and the solder bumps are fluxed by the flux material during the heating step.

3. The method according to claim 1, wherein the filler material consists essentially of nanoparticles.

4. The method according to claim 1, wherein the adhesive flows onto at least some of the bond pads.

5. The method according to claim 4, wherein the adhesive contains a flux compound.

6. The method as in claim 1, wherein each of the solder bumps has a portion that extends past the filled underfill material and a flux material is microjetted onto the portion of the solder bumps that extends past the filled underfill material to define a plurality of flux portions each being surrounded by the underfill material and the flux material is applied to the solder bumps after the filled underfill material is applied to the wafer.

7. A method of underfilling a flip chip die with a composite underfill layer comprising filled and unfilled regions, the method comprising the steps of:

microjetting a particulate filler material onto a surface of a wafer on which individual dies are delineated and separated by scribe lines, each of the dies having solder bumps associated therewith, the filler material being selectively deposited so as to surround the solder bumps and not cover the solder bumps or the scribe lines;

microjetting a polymer matrix material onto the filler material, the polymer matrix material being selectively deposited between the solder bumps and not over the solder bumps or the scribe lines, the polymer matrix material wetting the filler material so as to form in situ a filled underfill material in which the filler material is dispersed to reduce the coefficient of thermal expansion of the filled underfill material;

singulating the dies from the wafer along the scribe lines, without cutting through the filled underfill material to prevent underfill debris from separating from the surface of the wafer;

depositing an adhesive on a substrate having bond pads on a surface thereof, the adhesive being substantially free of a filler material;

registering the solder bumps of one of the dies with the bond pads on the substrate so that the filled underfill material and the adhesive fill a space defined by and between the die and the substrate and the adhesive extends onto a peripheral wall of the die;

heating the substrate, the solder bumps, the filled underfill material and the adhesive so that the solder bumps melt and so that the filled underfill material and the adhesive form a composite underfill layer having discrete filled and unfilled portions; and then cooling the molten solder bumps and the composite underfill layer so that the molten solder bumps form solid electrical connections that are metallurgically bonded to the bond pads, the composite underfill layer encapsulates the connections, the unfilled portion of the composite underfill layer defines a fillet that extends onto the peripheral wall of the die, and the space between the die and the substrate is free of voids.

8. The method according to claim 7, further comprising the step of microjetting a flux material onto the surface of the wafer so as to contact the solder bumps, wherein the polymer matrix material and the filler material are selectively deposited so that the filled underfill material surrounds and contacts the flux material, and the solder bumps are fluxed by the flux material during the heating step.

9. The method according to claim 7, wherein the filler material is deposited while suspended in a volatile solvent, and the polymer matrix material is deposited after evaporating the volatile solvent from the surface of the wafer.

10. The method according to claim 7, wherein the adhesive flows onto at least some of the bond pads.

11. The method according to claim 10, wherein the adhesive contains a flux compound.

* * * * *